United States Patent
Tazarine et al.

(10) Patent No.: US 9,648,742 B2
(45) Date of Patent: May 9, 2017

(54) PRINTED CIRCUIT BOARD, CIRCUIT AND METHOD FOR PRODUCING A CIRCUIT

(71) Applicant: Auto-Kabel Management GmbH, Hausen i.W. (DE)

(72) Inventors: Wacim Tazarine, Mönchengladbach (DE); Simon Betscher, Grevenbroich (DE); Frank Gronwald, Bedburg (DE)

(73) Assignee: Auto-Kabel Management GmbH, Hausen i.W. (DE)

( * ) Notice: Subject to any disclaimer, the term of this patent is extended or adjusted under 35 U.S.C. 154(b) by 0 days.

(21) Appl. No.: 15/105,723

(22) PCT Filed: Oct. 14, 2014

(86) PCT No.: PCT/EP2014/071994
§ 371 (c)(1),
(2) Date: Jun. 17, 2016

(87) PCT Pub. No.: WO2015/104072
PCT Pub. Date: Jul. 16, 2015

(65) Prior Publication Data
US 2016/0324002 A1   Nov. 3, 2016

(30) Foreign Application Priority Data

Jan. 13, 2014   (DE) .................. 10 2014 000 126

(51) Int. Cl.
*H05K 7/10*   (2006.01)
*H05K 1/14*   (2006.01)
(Continued)

(52) U.S. Cl.
CPC ........... *H05K 1/145* (2013.01); *H05K 1/0209* (2013.01); *H05K 1/056* (2013.01); *H05K 1/111* (2013.01);
(Continued)

(58) Field of Classification Search
CPC ..................................................... H01L 23/142
(Continued)

(56) References Cited

U.S. PATENT DOCUMENTS

2006/0225918 A1*  10/2006  Chinda ................ H01L 21/486
                                                                    174/260
2008/0186623 A1    8/2008  Cayaban et al. ........... 360/97.02
(Continued)

FOREIGN PATENT DOCUMENTS

DE    2004 043 276 A1    4/2005    ............... H05K 1/18
DE    2005 019 094 U1    6/2006    ............... H05K 7/20
(Continued)

OTHER PUBLICATIONS

German Patent and Trademark Office, Office Action—Application No. 10 2014 000 126.1, dated Dec. 4, 2014, 7 pages.
(Continued)

*Primary Examiner* — Binh Tran
(74) *Attorney, Agent, or Firm* — Sunstein Kann Murphy & Timbers LLP

(57) ABSTRACT

Circuit having a first printed circuit board and a second printed circuit board. In the circuit, the printed circuit boards spaced apart from one another by means of an air gap are mechanically connected together by at least one power semiconductor.

16 Claims, 4 Drawing Sheets

(51) Int. Cl.
- *H05K 1/05* (2006.01)
- *H05K 3/36* (2006.01)
- *H05K 7/00* (2006.01)
- *H05K 1/16* (2006.01)
- *H05K 1/18* (2006.01)
- *H05K 3/28* (2006.01)
- *H01L 23/14* (2006.01)
- *C23C 14/04* (2006.01)
- *H01L 23/367* (2006.01)
- *H05K 1/02* (2006.01)
- *H05K 1/11* (2006.01)

(52) U.S. Cl.
CPC .............. *H05K 1/142* (2013.01); *H05K 1/181* (2013.01); *H05K 3/368* (2013.01); *C23C 14/042* (2013.01); *H01L 23/142* (2013.01); *H01L 23/367* (2013.01); *H01L 23/3677* (2013.01); *H01L 2924/0002* (2013.01); *H05K 1/0206* (2013.01); *H05K 1/117* (2013.01); *H05K 1/182* (2013.01); *H05K 3/28* (2013.01); *H05K 3/282* (2013.01); *H05K 2201/09372* (2013.01); *H05K 2201/09554* (2013.01); *H05K 2201/10166* (2013.01); *H05K 2201/10689* (2013.01); *H05K 2203/1377* (2013.01)

(58) Field of Classification Search
USPC .................. 361/760, 764, 765, 767, 783
See application file for complete search history.

(56) References Cited

U.S. PATENT DOCUMENTS

| | | | |
|---|---|---|---|
| 2010/0012360 A1 | 1/2010 | Takahashi et al. | 174/257 |
| 2011/0100681 A1 | 5/2011 | Kimmich et al. | 174/252 |

FOREIGN PATENT DOCUMENTS

| | | | | |
|---|---|---|---|---|
| DE | 2005 048 702 A1 | 4/2007 | | H05K 1/05 |
| DE | 2008 001 414 A1 | 10/2009 | | H01L 25/07 |
| EP | 1 261 028 A2 | 11/2002 | | H01L 23/367 |

OTHER PUBLICATIONS

International Searching Authority, International Search Report—International Application No. PCT/EP2014/071994, dated Apr. 17, 2015, together with the Written Opinion of the International Search Authority, 20 pages.

European Patent Office, International Preliminary Report on Patentability—International Application No. PCT/EP2014/071994, dated Sep. 1, 2015, 16 pages.

* cited by examiner

PRINTED CIRCUIT BOARD, CIRCUIT AND METHOD FOR PRODUCING A CIRCUIT

This application is the national phase entry of international patent application no. PCT/EP2014/071994 filed Oct. 14, 2014 and claims the benefit of German patent application No. 10-2014-000-126.1, filed Jan. 13, 2014, the disclosures of which are incorporated herein by reference in their entirety.

The subject matter relates to printed circuit boards, as well as to a circuit and to a method for producing circuits, in particular for power semiconductors, in particular for SMD (Surface Mounted Device) components.

In semiconductor technology, printed circuit boards usually consist of insulating material as the substrate and a conducting layer from which conducting tracks are formed by etching. However, in the field of power semiconductors, the printed circuit boards can also additionally be provided with a metallic core, for example a copper core. This copper core is coated on both sides with the insulating material, a so-called prepreg, and is hence insulated all-over. Here, a copper film pressed onto a surface of the insulating material is also used as the conducting layer and conducting tracks are likewise formed on this copper foil. The conducting tracks formed from the copper foil are in part directly contacted to the metallic core, by contacting so-called μvias both to the conducting track and to the copper core through the prepreg. The other part of the conducting tracks is signal lines on the surface of the printed circuit board. However, applying the so-called μvias is complicated and elaborate, since it is necessary, for example, to mill the prepreg after the copper foil has been applied and introduce a metallic material into it. Subsequently, the conducting tracks have to be etched. The μvias only have small conductive diameters, so that both the electrical and the thermal transition resistances are high and the cooling effect is limited. Milling the vias is also complicated, since only very small openings can be milled or drilled.

Another technology, which is used particularly in the field of LEDS, is the use of a copper or aluminium base board exclusively for cooling. The copper or aluminium base board is completely insulated with respect to the conducting tracks by means of an insulating material, for example the prepreg. There are no electrically conducting connections at all between the copper or aluminium base board and the conductive tracks. Thermal energy is conducted through the prepreg to the copper or aluminium base board. In this way, electrical components connected to the conducting tracks can be cooled via the copper or aluminium base board. However, the cooling effect is hindered by the prepreg and electrical contacting via the copper or aluminium base board with this technology is neither possible nor is it desired. In addition, a heat sink using a heat-conductive paste can be attached underneath the copper or aluminium base board.

The technologies mentioned are either too expensive or do not have sufficient cooling means for high-power semiconductors used in the automotive sector. Therefore, the subject matter of the invention was based on the object of providing printed circuit boards which, on the one hand, can be produced easily and cost-effectively and, on the other hand, enable the power semiconductors to be sufficiently cooled.

This object is achieved by means of a printed circuit board according to claim 1, a printed circuit board according to claim 7, a circuit according to claim 18 and a method according to claim 20.

It has been recognised that the cooling effect of a copper plate can be increased if it is directly provided with a contact for the semiconductor. It is proposed that a metallic base board is used. This metallic base board can consist of copper. Alloys of copper are also possible. In addition, it also possible for the metallic base board to consist of aluminium, for example in order to save weight, and to be metallically coated on the surface, in particular with copper or a copper alloy.

An insulating layer is applied onto the base board, in particular an insulating lacquer, which electrically insulates the base board. However, the base board is free of the insulating layer in one connection area.

In order to now electrically and thermally contact a semiconductor mounted on the printed circuit board, in particular a power or high-power semiconductor, directly to the base board, it is proposed that the base board is metallically coated in the connection area. The metallic coating can be formed before the insulating layer is applied or after the insulating layer has been applied.

The semiconductor is preferably a transistor, preferably a power transistor. In particular, the semiconductor can be a high-power semiconductor with a current-carrying capacity of over 10 amperes, preferably over 50 A, in particular more than 300 A. In particular, transistors, thyristors, triacs or suchlike can be used. IGB transistors and power MOSFETs can also be used.

The use of the circuit in terms of the subject matter of the invention is preferably in the area of rectifiers, in particular in the area of the battery management of a vehicle. In particular, the use as a rectifier in an electric vehicle or a hybrid vehicle is preferred. Preferably, a use in applications which work with currents of more than 10 A, preferably more than 50 A or more than 300 A, is proposed.

The metallic coating is applied directly onto the base board and subsequently serves as a contact for the semiconductor. A contact of the semiconductor is electrically contacted on the metallic coating of the connection area. The base board therefore serves as a thermal and electrical element. Due to the fact that the metallic coating directly serves to contact the semiconductor to the base board, a very good thermal contact is ensured between the semiconductor and the base board. The base board directly serves as a supply conductor for a contact of the semiconductor and can be electrically contacted from an area outside of the insulating layer.

The base board can be a flat component, in particular a strip or sheet.

The contact of the semiconductor is preferably a drain or source contact, wherein this designation here is representative of the contacts of the semiconductor carrying the power. Gate or switch contacts of the semiconductor usually only carry switching currents and the switched current flows via the at least two other contacts. The semiconductor is preferably an SMD component which directly rests on the metallic coating of the connection area. Non-conducting areas of the semiconductor can rest on the insulating layer.

The insulating layer is preferably a solder resist which, for example, is applied in such a way that the connection area is free of the insulating layer. Subsequently, the connection area can be metallically coated by coating it with tin.

Preferably, the insulating layer is printed onto the base board before the metallic coating.

According to one embodiment, the metallic coating is a tin layer. The tin layer is preferably applied over a large surface area on the base board, for example on a connection surface between 5 $cm^2$ and 0.5 $mm^2$ in each case.

In order to mechanically support the semiconductor and keep the electrical contacting as free of mechanical stresses as possible, it is proposed that the mechanical coating is essentially plane-parallel to the surface of the insulating layer. In this case, non-conducting areas, which surround the contact of the semiconductor, rest directly on the insulating layer. The semiconductor usually has a drain or source contact with a large surface area. Preferably, the connection area or the metallic coating with respect to its surface area is essentially congruent to the surface area of the semiconductor contact.

During manufacture, the semiconductor can then be directly placed on the connection area. Non-conducting areas, particularly in edge regions of the semiconductor, can rest on the insulating layer and attaching the semiconductor is therefore particularly simple. A large contact surface between the contact of the semiconductor and the metallic coating also results, so that, in addition to a good electrical contact, excellent conduction of heat from the contact of the semiconductor into the base board is made possible.

As already mentioned, the semiconductor or the contact of the semiconductor is electrically contacted to the base board through the metallic coating. The base board can have a connection at one end for contacting to an electric circuit. Here, for example, there can be a drill-hole for receiving a terminal lug. A cable shoe or a crimp connection can also be provided at the end of the base board, and in this way the printed circuit board can be electrically contacted in a particularly simple manner.

In particular, it should be borne in mind that high current-carrying capacity is made possible. Therefore, contacting to an electric circuit is preferably effected with a wire having a wire cross-section of at least 2.5 mm$^2$, so that the contacting at the end of the base board also has to have a contact surface of such a size. The conductor cross-section of the base board must also be chosen such that it at least corresponds to, but preferably is greater than, the wire cross-section of the connected wire.

Preferably, along a common outer edge, in particular a longitudinal edge of the base board, two or more connection areas are arranged next to one another, separated by the insulating layer. In particular, more than two connection areas assigned to one another can be arranged on an outer edge of the base board. The connection areas can also be arranged on two distal outer edges of the base board.

According to a further aspect, a printed circuit board is proposed which also has a metallic base board. The metallic base board can be the same as the metallic base board of the printed circuit board according to claim 1. In particular, the same materials, the same conductor cross-sections and/or the same form factors can be used. This makes mass production of the printed circuit boards advantageous.

The metallic base board is also coated such that it is electrically insulated on at least one surface. The insulator used can initially be applied over the whole surface of the base board. In particular, an insulator customarily employed as a substrate for printed circuit boards can be used. This can be a plastic sheet. In particular, a so-called prepreg layer consisting of pre-impregnated fibres can be used as an insulator. Subsequently, a conducting layer is applied onto the insulator. The insulator and the conducting layer can be pressed in full surface contact with the base board. The conducting layer can, for example, be a copper layer.

Conducting tracks can be etched from the conducting layer in a known way, as is customary in the production of conventional printed circuit boards.

In addition, an insulating layer, in particular an insulating coating, as in the case of the printed circuit board according to claim 1, can be applied onto the insulator and the conducting layer. This can also be an insulating lacquer, in particular a solder resist. This can take place before or after forming the conducting tracks.

The insulator and the conducting layer, if they have not been etched away yet, can be perforated by milling or drilling, in order to form a contact area to the base board. Here, window-like through holes in the insulator form the contact area. In the contact area, the base board can be initially exposed, so that then at least one contact pad can be formed on it.

In order to now enable contacting of a semiconductor, it is proposed that in the contact area at least one metallic contact pad is arranged on the base board. At the same time, the contact pad is peripherally spaced apart from the insulator and the conducting layer. Here, the contact pad can protrude at least out of the plane of the insulator. If an insulating layer, e.g. an insulating lacquer, is also additionally formed on the insulator, the contact pad can end essentially in the plane of the insulating layer.

The contact pad is completely peripherally spaced apart from the conducting layer, in order to prevent an electrical contact forming between the contact pad and the conducting layer. Therefore, the contact pad, different from the case with conventional μvias, is not suitable for connecting the conducting track of the conducting layer to the base board, in order to enable the conducting track of the conducting layer to be cooled. Instead, the base board as an electrically conducting element is directly contacted to the contact pad and an electrical contact, in particular a source or drain contract of a semiconductor, can be placed on the contact pad. The contact surface, in contrast to the μvias, is also formed as a window-like through hole of the insulator, so that it is easy to produce. The contact surface is usually 2 to 10 times, preferably 4 to 7 times, as large as the surface of an individual contact pad.

Particularly if the semiconductor is an SMD component, and the source or drain together with the gate are to be contacted along an edge of the semiconductor by means of contact pins which lie in one plane, it is advantageous if the contact pads are essentially plane-parallel to the conducting layer. In this case, the semiconductor can be placed on the contact pad and, at the same time, on the conducting layer. Twisting or tilting relative to the conducting layer or the contact pad is then impeded. A gate contact pin can be contacted on the conducting layer or the conducting track of the conducting layer and the contact pad can be contacted to the drain or source contact pin.

In particular, a plurality of contact pads arranged next to one another can be formed which in each case have a contact surface corresponding to a contact pin of the semiconductor. A plurality of drain or source contact pins and a gate pin are arranged on the semiconductor along a common edge. The corresponding source or drain contact is provided on a distal end. The plurality of source or drain contact pins, which are arranged on the side of the gate contact pin, can be placed on the contact pad or the contact pads which are arranged next to one another and the gate contact pin can be placed on the conducting layer. Particularly simple contacting can subsequently take place by means of SMD soldering.

In order to produce the contact pad on the base board, the contact area can be coated with a photoresist and then exposed in the area of the contact pad spaced apart from the insulator. After removing the exposed area of the photoresist the base board is bare there. In this area, the contact pad can then preferably be chemically constructed. The non-exposed areas of the photoresist or of the base board do not have copper applied to them. The contact pad produced is therefore spaced apart from the insulator and the conducting layer.

The contact pad has a solderable metal surface. As mentioned, this can be chemically constructed, for example by applying nickel or tin. Nickel or gold can also be galvanically applied. Chemically applying tin or silver in the exposed area is also possible. Construction of the contact pad can continue until its surface is plane-parallel either to the insulating layer or to the conducting layer. Here, a deviation of the planes of the contact pad and of the conducting layer or of the insulating layer of less than 10 µm and less is considered to be plane-parallel.

In order to enable the contact pad to be electrically insulated from the conducting layer and/or the insulating layer, a distance or annular space between the contact pad and the conducting layer and/or the insulator is proposed. The distance between the contact pad and the conducting layer and/or the insulator can be between 10 mm and 0.5 mm.

The space between the contact pad and the conducting layer and/or the insulator can be free of filling material. In particular, an air gap can be present. It is also possible for the insulating layer to be introduced into the space.

As already mentioned, a source or drain contact can be connected to a contact pad. In order to contact the associated gate contact, which is preferably arranged along the same edge of the semiconductor, to the conducting layer, the conducting layer or the conducting track of the conducting layer can have a connection pad. The connection pad has a solderable surface and serves to connect the gate contact.

Both the connection pad and the contact pad or the contact pads lying next to one another can be arranged along a common outer edge of a printed circuit board.

Both connection pads and contact pads are provided for contacting a semiconductor to the printed circuit board. The contact pads can contact a plurality of electrically similar pins, i.e. a plurality of or all of the pins of a drain or source contact, of a semiconductor, by providing a plurality of contact pads arranged next to one another. The contact pads can be contacted to one or more pins of a source or drain contact of a semiconductor. In addition to that, the connection pad can be electrically contacted to a pin of a gate contact of the semiconductor. The solder areas of the contact pad and the connection pad spaced apart from one another are congruent to the distances between the contact pins of the semiconductor.

An outstanding electrical and thermal connection between the base board and the semiconductor is enabled by means of the metallic coating of the contact pad. In this respect, it is proposed that the source or drain contact is electrically contacted to the base board through the contact pad. It is also proposed that the base board has a free end for contacting the source or drain contact to an electric circuit. Corresponding to the printed circuit board according to any one of claims 1 to 6, contacting with a large conductor cross-section is also necessary here. Thus, corresponding contacts on the free end of the base board can be provided.

It is also proposed that the gate contact is electrically contacted to the conducting layer. Conducting tracks can be provided on the conducting layer, in particular etched from the conducting layer, and accommodate at least parts of a control circuit for the gate contact. In this way, at least parts of a control circuit can be provided for the semiconductor directly on the printed circuit board.

According to one embodiment, it is proposed that at least one connection pad and at least one contact pad are arranged in the area of an outer edge of the printed circuit board. The connection pad and the contact pad can be arranged next to one another in particular along a longitudinal edge of the printed circuit board. The connection pad can be arranged directly next to the contact pad on an outer edge of the printed circuit board.

In order to prevent a soldered semiconductor from tilting, it is proposed that the connection pad and the contact pad are arranged essentially plane-parallel to one another. The solder areas of the connection pad and the contact pad can be formed such that they lie essentially in one plane.

According to one exemplary embodiment, it is proposed that the base board has a thickness of at least 1 mm, preferably of at least 1.5 mm, but less than 50 mm. It is also proposed that the conductor cross-section of the base board is over 2.5 mm$^2$.

As already mentioned, the base boards can consist of copper or an alloy thereof. It is also possible for the base board to consist of aluminium or an aluminium alloy and be coated with copper.

The respective base board can be free of the insulating layer and/or the insulator at one end. The base board can, for example, be tin-plated and/or nickel-plated at this free end. An electrical connection point can also be provided in the area of the free end, in order to receive a high-current cable.

A further aspect is a circuit, in particular a circuit having a first printed circuit board according to claim 1 and a second printed circuit board according to claim 7. The circuit is characterised in that the two printed circuit boards are arranged next to one another facing one another and are spaced apart from one another by a gap. The two printed circuit boards can be insulated from one another by means of the gap. The gap can also be an air gap. The gap can also be filled with an insulating material.

The printed circuit boards can be mechanically and electrically connected together by at least one semiconductor bridging the gap, which is electrically and mechanically fixed to the contact pads, the connection pad and the metallic coating.

The outer edge of the first printed circuit board having the connection area can run parallel to an outer edge of the second printed circuit board accommodating the contact area. This makes the mechanical connection of the printed circuit boards to one another via the semiconductor easier.

The contact area and/or the contact pad can be arranged on the outer edge of the second printed circuit board facing the first printed circuit board. This also makes the mechanical connection of the printed circuit boards by means of the semiconductor easier. This equally applies if the connection area and/or the metallic coating is arranged on the outer edge of the first printed circuit board facing the second printed circuit board.

In the cases mentioned, the first printed circuit board together with the second printed circuit board can be mounted with at least one identical semiconductor. The semiconductor can be electrically and mechanically fixed on the first printed circuit board with at least one pin and with a second pin on the second printed circuit board. The concept of the subject matter is not impaired if the printed circuit boards after mounting are held in a housing or a holder and are thereby additionally mechanically fixed to one another.

As already mentioned, both the metallic coating of the printed circuit board according to claim 1 and the contact pads and connection pads of the printed circuit board according to claim 7 can be arranged along a common outer edge in each case. These respective outer edges can be arranged facing one another in the circuit. The base boards run essentially parallel to one another.

The gap is electrically and preferably exclusively mechanically bridged by the power semiconductor. In particular, the semiconductors, which in particular are SMD soldered to the metallic coating, the contact pads and the connection pads, are responsible for the mechanical connection between the two printed circuit boards.

The contact pad is arranged on the edge of the second printed circuit board facing the first printed circuit board and the metallic coating is arranged of the first printed circuit board facing the second printed circuit board.

The contact pad of the second printed circuit board and the metallic coating of the first printed circuit board are facing one another. Contacting of the printed circuit boards takes place by means of at least one identical, common power semiconductor.

A method for producing a circuit proposes that a printed circuit board according to claim 1 and a printed circuit board according to claim 7 are conveyed to a mounting device. Here, the printed circuit boards are spaced apart from one another. A semiconductor is placed across the gap and is then connected to the contact pad, the connection pad and the metallic coating, particularly by soldering. Therefore, the mounting of the printed circuit boards is carried out in such a way that a semiconductor bridging the gap between the printed circuit boards is arranged on the printed circuit boards.

The printed circuit boards can be produced from two separate base boards and subsequently conveyed on a common product carrier to a mounting device.

It is also possible for a first printed circuit board according to claim 1 together with a second printed circuit board according to claim 7 to be firstly formed on a monolithic base board. For example, a base board can be firstly separated in such a way that a gap is formed between the two printed circuit boards, wherein this gap is bridged by webs of the base board and hence the base board remains monolithic. Subsequently, on a first printed circuit board the contacts can be produced on the connection surfaces. The contact pads on a contact surface, the connection pads and the conducting tracks can be formed on a second printed circuit board. Subsequently, the base board is mounted with at least one semiconductor, wherein it connects the opposing contacts and contact pads or connection pads together. The webs which then still exist can subsequently be removed, e.g. milled out. The base board is now at least in two parts, wherein two printed circuit boards formed from it are mechanically and electrically connected together by means of the semiconductor.

Preferably, one of the printed circuit boards is U-shaped and the second printed circuit board is arranged within the U-shape. In particular, the printed circuit board according to claim 1 is U-shaped and the contacts and the metallic coating are respectively arranged on the legs pointing inwards. The printed circuit board according to claim 7 is arranged between the legs forming the U-shape and the contact pads and connection pads are respectively arranged on distal edges pointing in the direction of the legs.

The subject matter is explained in more detail below with the aid of the figures showing exemplary embodiments.

Figure 1:
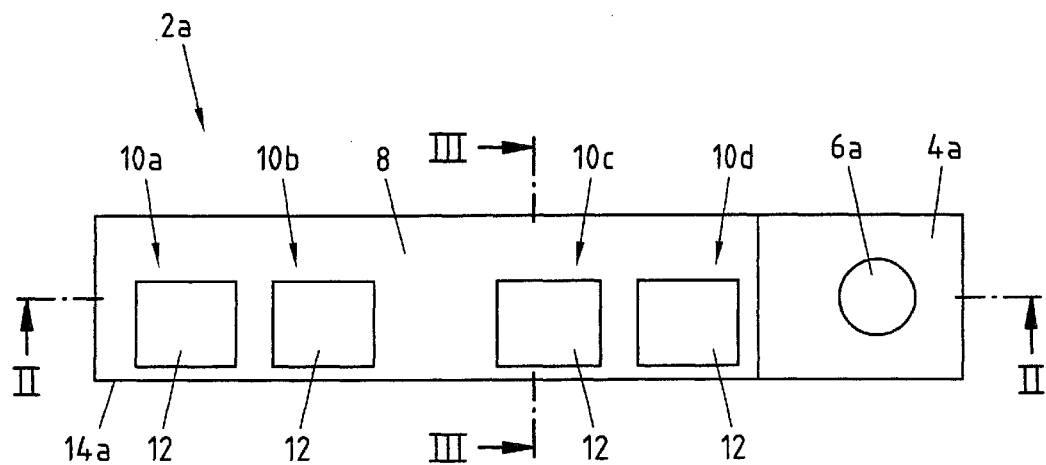
FIG. 1 shows a plan view of a printed circuit board with metallic coatings.

FIG. 1 shows a first printed circuit board 2a. This printed circuit board can be a high-current printed circuit board with a current-carrying capacity of over 10 amperes, preferably of over 300 amperes. For this purpose, the printed circuit board has a metallic base board. The base board has a conductor cross-section of over 5 mm$^2$, preferably over 15 mm$^2$, in particular over 35 mm$^2$.

In the plan view of the printed circuit board 2a, it can be identified that the base board has a connection 6a at a first free end 4a. In the illustrated case, this is a drill hole which can serve to receive a cable. On the free end 4a the base board 2a is e.g. coated with tin, but in particular it is free of an insulating layer.

A predominant part, in particular more than two-thirds of the surface of the printed circuit board 2a is insulated and hence has an insulating layer 8. The insulating layer 8 is preferably a solder resist which is printed onto the printed circuit board 2a. This can be performed by a screen printing process, for example.

As can be identified, the insulating layer 8 is not present in four connection areas 10a-10d. A metallic coating 12 is applied in the connection areas 10a-10d instead of the insulating layer 8. The metallic coating 12 is preferably a tin layer or another layer suitable for soldering.

While the insulating layer 8 is printed onto the printed circuit board 2a, the connection areas 10a-10d are recessed and then the metallic coating 12 is applied. The metallic coating 12 can form a contact for the semiconductor. The structure of the printed circuit board 2a is illustrated in more detail in the section II-II according to FIG. 2.

Figure 2:
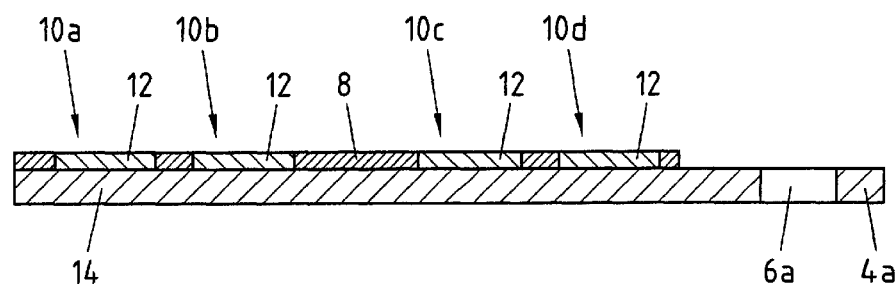
FIG. 2 shows a sectional view of the printed circuit board according to FIG. 1.

It can be identified in FIG. 2 that the printed circuit board 2a has a metallic base board 14. The metallic base board 14 can consist of copper or alloys thereof. It is also possible for the metallic base board 14 to essentially consist of aluminium or alloys thereof and be coated with copper or alloys thereof or tin.

It can also be identified that the insulating layer 8 is applied onto the metallic base board 14. The metallic base board 14 is free of the insulating layer 8 in the connection areas 10a-10d and the metallic coating 12 is applied. The metallic coating 12 is applied directly onto the metallic base board 14. It can be identified in FIG. 2 that the metallic coating 12 essentially runs along a surface which is plane-parallel to the surface of the insulating layer 8.

It can also be identified that the connection areas 10a-10d are, by way of example, respectively provided in groups consisting of two connection areas 10a, b and 10c, d assigned to one another. The spatial arrangement along the longitudinal axis of the printed circuit board 2a of the connection areas 10a-10d is dependent on the subsequent mounting operation.

Figure 3:
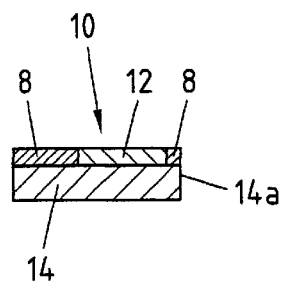
FIG. 3 shows a further sectional view of the printed circuit board according to FIG. 1.

FIG. 3 shows the section III-III according to FIG. 1. The metallic base board 14 and the insulating layer 8 can be identified again. It can also be identified that on a longitudinal or outer edge 14a of the base board 14 a respective connection area 10a-10d is provided. It can be identified that the connection area 10 does not terminate directly at the longitudinal edge 14a, but that a relatively narrow area of the insulating layer 8 remains between the coating 12 and the longitudinal edge 14a. This area is preferably less than 1 mm, preferably less than 0.5 mm, in particular less than 0.1 mm. It is, however, also possible for the metallic coating 12 to come up to the longitudinal edge 14a.

The printed circuit board 2a is suitable for connecting to a drain or source contact of a transistor, in particular of a high-power transistor in the SMD construction method. Such a transistor has a source or drain contact with a large surface area which can be soldered to the metallic coating 12. Due to the fact that the metallic coating 12 is preferably essentially congruent to the surface of the source or drain contact, the latter can rest on the connection area 10 over a large surface area and, in addition to a good electrical contact, thermal energy is thermally dissipated effectively from the semiconductor via its drain or source contact into the base board 14.

Figure 4:
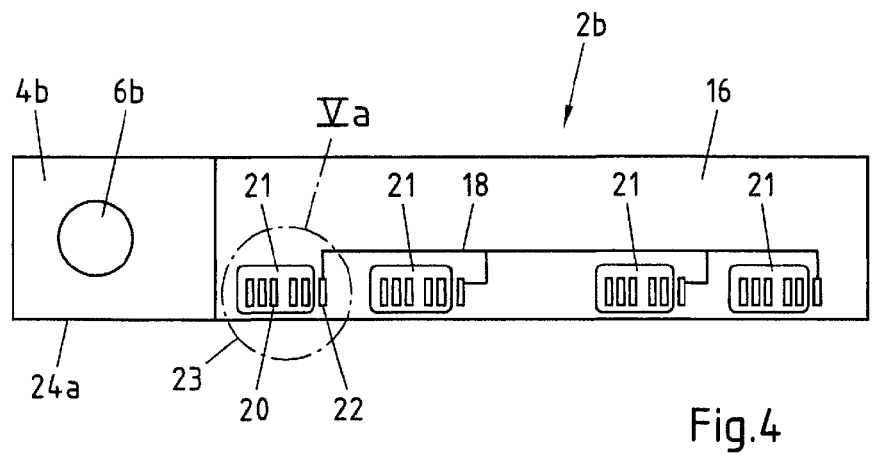
FIG. 4 shows a plan view of a printed circuit board with contact pads and connection pads.

FIG. 4 shows a second printed circuit board 2b which also has a free end 4b and a connection 6b. The free end 4b is formed corresponding to the free end 4a. It can also be identified that an insulator, e.g. a synthetic material, a prepreg or suchlike 16 is applied onto the printed circuit board 2b. This insulator 16 can be pressed together with a conducting layer onto a metallic base board 24. Subsequently, a conducting track 18 can be created by exposure and etching from the conducting layer. The conducting track 18 runs corresponding to a circuit topology on the insulator 16 and serves to connect control electronics (not illustrated).

Contact pads 20 and connection pads 22 can be provided facing an outer edge. In particular, the connection pad 22 can be directly contacted to the conducting path 18. However, the contact pads 20 are arranged in a window-like through hole 21 of the insulator 16. The base board 24 is initially exposed in this through hole 21. An insulating layer 8 can be applied later after the contact pads 20 have been formed. In the through hole 21, the contact pads 20 are spaced apart from the insulator 16 and the conducting tracks 18 or the conducting layer by an insulating gap, in particular an air gap. As can be identified, a plurality of contact pads 20 are provided in a through hole 21. A connection pad 22 assigned to the contact pad 20 can be provided on the insulator 16 directly next to a through hole 21. The number of contact pads 20 and connection pads 22 can be chosen corresponding to the number of contact pins of a power semiconductor. In particular, for thermal dissipation a transistor has a plurality of source or drain contact pins and just one gate contact pin. The gate contact pin can be connected to the connection pad 22 and the source or drain contact pins can be connected to the contact pads 20. In order to prevent the contact pins 20 from becoming electrically short-circuited with the connection pad 22, the electrically conducting area of the contact pads 20 must be insulated from the conducting track 18. For this purpose, after the insulating layer 16 and the conducting layer have been pressed onto the base board 14 a through hole 21 respectively assigned to a connection pad 22 can be milled or drilled through to the base board 14. A photoresist can then be exposed in the through hole 21. The exposed area can correspond to the area of the contact pad 20. This area of the photoresist is removed and then the contact pads 20 are directly constructed on the base board 24, e.g. chemically. This construction is illustrated in detail 23 in FIGS. 5a and 5b.

Figure 5A:
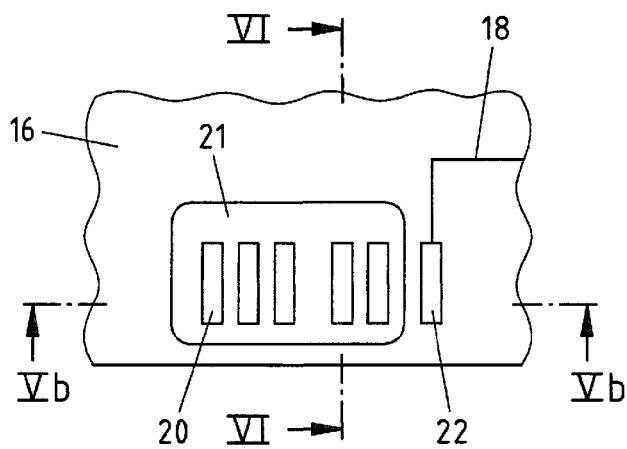
FIG. 5 shows a sectional view of a printed circuit board according to FIG. 4.
Figures 5B, 6:
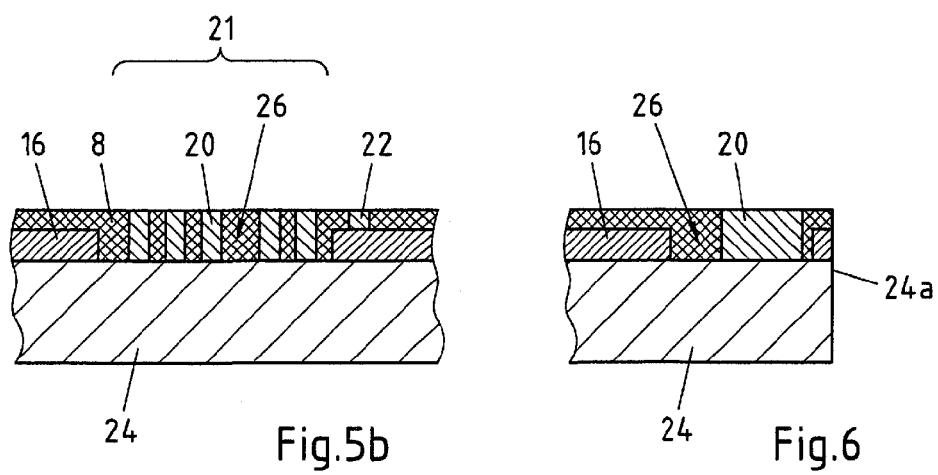
FIG. 6 shows a sectional view of a printed circuit board according to FIG. 4.

FIG. 5b shows the detail 23 illustrated in the section V-V. FIG. 5 shows a metallic base board 24 which can be formed corresponding to the metallic base board 14. The insulator 16 and a conducting layer, which is not illustrated, can be pressed onto the metallic base board 24. Subsequently, the conducting layer can be exposed and etched, so that conducting tracks 18 form on the insulator 16.

The insulator 16 is removed, e.g. drilled or milled, in the through hole 21. The conducting layer can also be removed, e.g. drilled or milled or in particular etched, in the through hole 21. Subsequently, within the through hole 21, at least one contact pad 20 can be applied to the metallic base board 24 by thermal and/or galvanic processes. As can be identified, the through hole 21 is formed in such a way that the contact pad 20 is spaced apart from the insulator 16. Furthermore, there is no contact to the conducting layer and also no contact to the conducting tracks 18. After the contact pad 20 has been formed, an insulating layer 8, in particular as also on the rest of the printed circuit board 2b, with the exception of the end 4b, can also be applied in the area of the through hole 21.

The connection pad 22, which can be produced by exposing and etching a conducting layer, is in contact with the conducting tracks 18. The contact pads 20 and connection pads 22 are coated such that they are solderable and/or are formed from solderable material. As can be identified, the contact pads 20 on their surface pointing outwards are essentially parallel to the insulating layer 16 and preferably plane-parallel to the conducting tracks 18 and the connection pad 22.

FIG. 5a shows the detail 23 in plan view. It can be identified that in a through hole 21 a plurality of contact pads 20 are provided at a distance from the insulator 16. The insulator 16 is removed in the through hole 21 and the metal of the base board can be directly coated. It can also be identified that the connection pad 22 is arranged laterally from the through hole 21.

The section VI-VI of FIG. 4 is illustrated in FIG. 6. Corresponding to the metallic coatings 12, the contact pads 20 are also assigned to an outer or longitudinal edge 24a, but preferably spaced apart from it by a strip of the insulator 16. This strip is corresponding to FIG. 3 very narrow, preferably less than 1 mm. However, the strip can also be omitted and the contact pads 20 can terminate directly at the longitudinal edge 24a.

The printed circuit boards 2a, 2b manufactured according to FIG. 1 and FIG. 4, are arranged spaced apart from one another by an air gap 28. Here, as can be identified in FIG. 7, the longitudinal edges 14a and 24a are facing one another. In addition, along the longitudinal edges 14a, 24a, the metallic coatings 12 and the contact pads 20 and the connection pads 22 are provided at an equal distance from the connections 6a, 6b. As a result, when the printed circuit boards 2a, 2b assigned to one another are arranged next to one another, the metallic coatings 12 are facing the contact pads 20 and connection pads 22.

Figure 7:
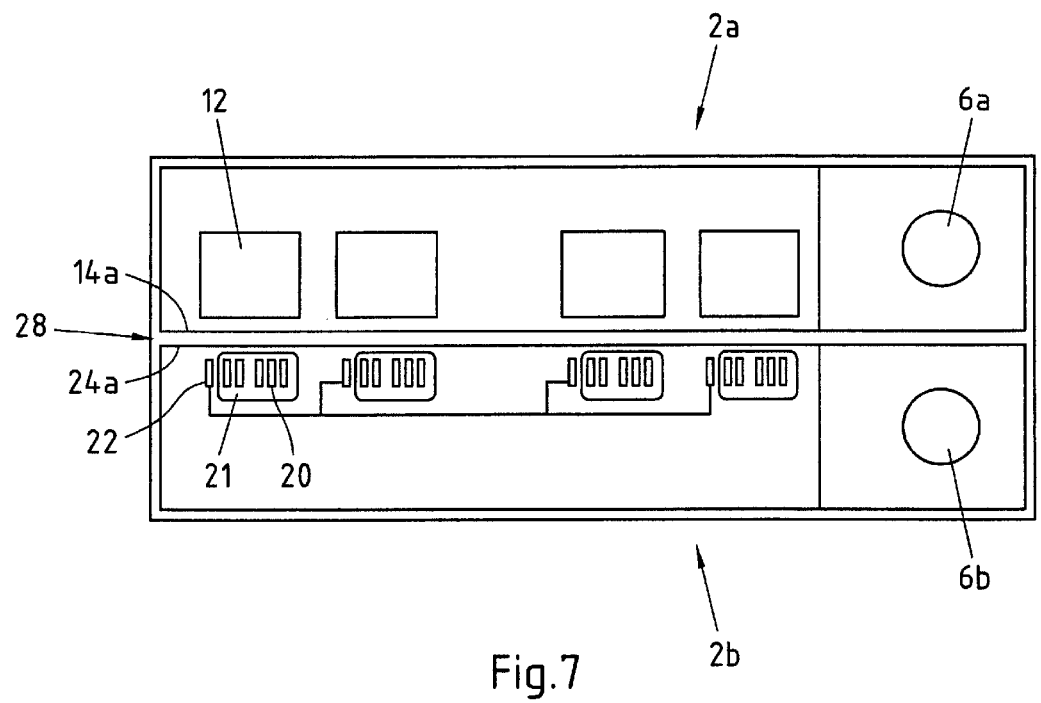
FIG. 7 shows a plan view of printed circuit boards according to FIG. 1 and FIG. 4 arranged next one another for mounting.
Figure 8:
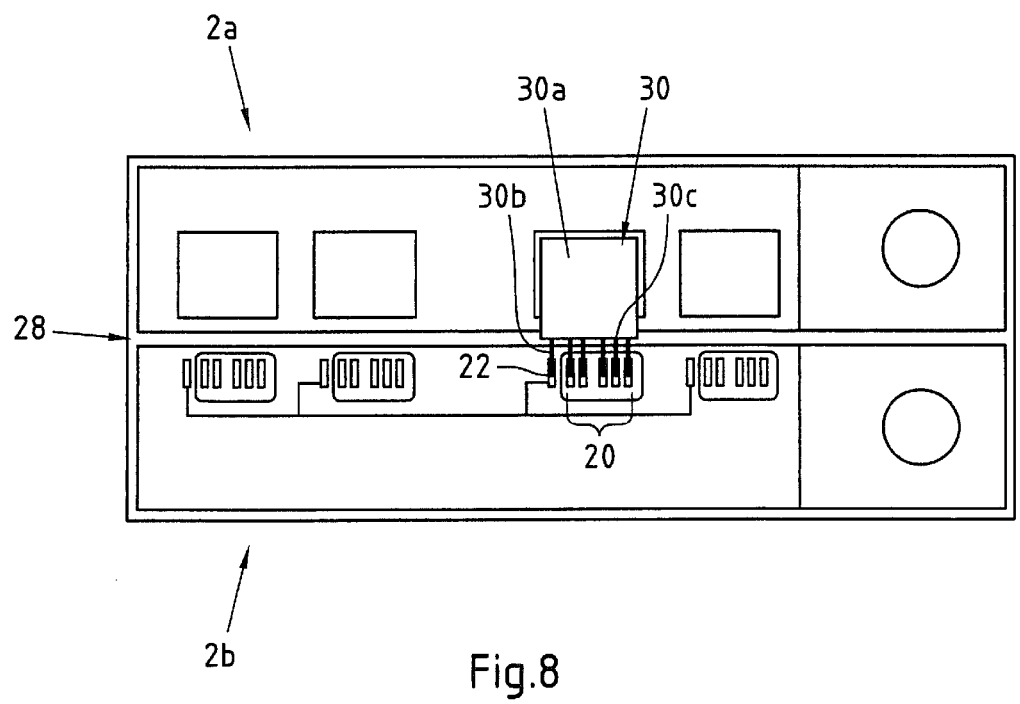
FIG. 8 shows a plan view of two printed circuit boards mounted with one power semiconductor.

The printed circuit boards 2a, 2b arranged according to FIG. 7 are then conveyed to a mounting device and mounted with transistors 30. As can be identified, the air gap 28 between the base boards 14, 24 is mechanically and electrically bridged by the transistor 30, as can be identified in FIG. 8.

The transistor 30 has a drain connection 30a on its one side. This is preferably arranged over a large surface area on the underside of the transistor 30. The drain connection 30a is soldered onto the metallic coating 12 using soldering technology. On the opposite side the transistor 30 is equipped with a gate contact pin 30b and five source contact pins 30c. The gate contact pin 30b is connected to the connection pad 22 by soldering. The source contact pins 30c are connected to the contact pads 20 by soldering. The printed circuit boards 2a, 2b become mechanically fixed to one another by soldering the transistor 30 onto the metallic coating 12 and the contact pads 20 and connection pads 22. Of course, further transistors can also be mounted on the printed circuit boards 2a, 2b. It is also self-evident that the conducting tracks 18 can be used to create control electronics for the gate contact pin via the conducting tracks 18. It is also possible to carry out a double-sided mounting operation, according to which semiconductors would be arranged on the top side and on the underside of the printed circuit boards.

Figure 9:
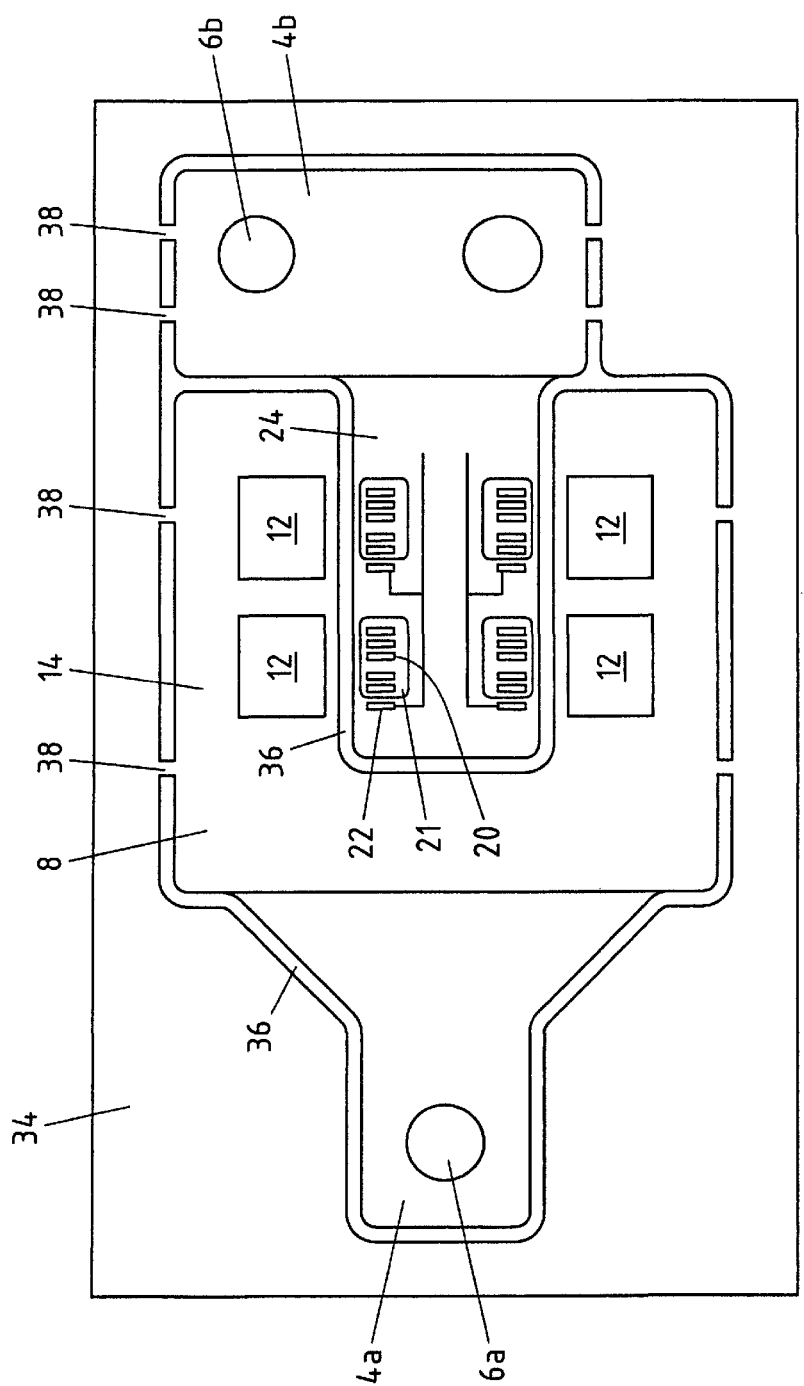
FIG. 9 shows a plan view of a monolithic base board with two printed circuit boards before separation of the strips.

FIG. 9 shows a metallic holder 34. A first base board 14 and a second base board 24 are formed into it. This can, for example, be effected by milling corresponding gaps 36 in the holder 34. It can be identified that the holder 34 is monolithic and the base boards 14 and 24 are mechanically connected to one another and to the holder 34 by strips 38.

The holder 34 is worked such that, as described above, the metallic coatings 12 are formed on the base board 14 and the contact pads 20 and the connection pads 22 are formed on the base board 24. Subsequently, or beforehand, the gaps 36 can be provided with the strips 38 in the holder 34. It can be identified that the gap 36 between the printed circuit boards 14 and 24 reproduces a U-shape. The printed circuit board 14 is U-shaped and the metallic coatings 12 are provided on the legs. Of course, the term metallic coating 12 means that a contact or connection, in particular a soldered connection, is formed on the base board 14. The printed circuit board 24 is arranged in the U.

Subsequently, a mounting operation, e.g. by means of SMD mounting, can take place. At least one transistor can be soldered to the metallic coating, on the one hand, and to the contact pads 20 and the connection pads 22, on the other hand. After the solder has hardened, the transistors mechanically and electrically connect the printed circuit boards 14 and 24 together. The strips 38 can be removed. The single mechanical and electrical connection between the base boards 14 and 24 is then formed by the transistors.

The invention claimed is:

1. A circuit comprising:
a first circuit board comprising:
a first metallic base board;
an insulation layer electrically insulating the first metallic base board on one surface, wherein the base board is free of the insulation layer in at least one connection area, wherein the base board is metallically coated in the connection area; and
a semiconductor component having a contact electrically contacted on the metallic coating of the connection area, and non-conductive areas of the semiconductor component that sit on the insulation layer;
a second printed circuit board comprising:
a second metallic base board;
an insulator electrically insulating the metallic base board on one surface; and
a conducting layer applied onto the insulator, wherein the insulator and the conducting layer are cut out in at least one contact area, and in that at least one metallic contact pad is arranged on the base board in the contact area such that the contact pad is circumferentially spaced apart from the insulator and the conducting layer; and wherein the first circuit board is spatially spaced from the second circuit board by an air gap or by an insulation material.

2. Circuit according to claim 1, wherein the contact pad is essentially plane-parallel to the conducting layer.

3. Circuit according to claim 1, wherein the contact pad is arranged in an exposed region of the contact area.

4. Circuit according to claim 1, wherein the contact area is formed for accommodating at least two contact pads, and in that the contact area is free of the insulator, and/or in that an annular space is arranged between the contact pad and the conducting layer and/or the insulation layer, in particular in that the distance between the contact pad and the conducting layer is less than 1 mm.

5. Circuit according to claim 1, wherein the space which is present between the contact pad and the conducting layer and/or the insulator is free of filling material and/or is coated with an insulating layer.

6. Circuit according to claim 1, wherein at least one connection pad is electrically connected to the conducting layer.

7. Circuit according to claim 6, wherein the contact pad is electrically contacted to a source or drain contact of a power semiconductor, and in that the at least one connection pad is electrically contacted to a gate contact of the power semiconductor.

8. Circuit according to claim 7, wherein the source or drain contact is electrically contacted to the base board of the second printed circuit board by the contact pad of the second printed circuit board, and/or in that the base board of the second printed circuit board has a free end for contacting the source or drain contact to an electric circuit, and/or in that the gate contact is electrically contacted to the conducting layer, and in that conducting tracks are formed on the conducting layer of the second printed circuit board for a control circuit of the gate contact.

9. Circuit according to claim 6, wherein at least one connection pad of the second printed circuit board and/or at least one contact pad of the second printed circuit board are arranged in the area of one edge of the second printed circuit board, and/or in that the contact area of the second printed circuit board is arranged along one longitudinal edge of the second printed circuit board.

10. Circuit according to claim 6, wherein the connection pad of the second printed circuit board and the contact pad of the second printed circuit board are arranged essentially plane-parallel to one another.

11. Circuit according to claim 1, wherein the base board of the second printed circuit board has a thickness of at least 1 mm, but less than 50 mm, and/or in that the base board of the second printed circuit board is comprised of copper or an alloy thereof, or in that the base board of the second printed circuit board is comprised of aluminium or an alloy thereof and has a copper coating, and/or in that the base board of the second printed circuit board is free of the insulating layer at one end, and/or in that the free end of the base board of the second printed circuit board forms an electrical connection point.

12. Circuit according to claim 11, wherein the printed circuit boards are mechanically connected together by at least one semiconductor, and/or in that the outer edge of a first printed circuit board having the connection area runs parallel to an outer edge of a second printed circuit board accommodating the contact area, and/or in that the contact area and/or the contact pad is arranged on the outer edge of the second printed circuit board facing the first printed circuit board, and/or in that the connection area and/or the metallic coating is arranged on the outer edge of the first printed circuit board facing the second printed circuit board, and/or in that the contact area and/or the contact pad of the second printed circuit board and the connection area and/or the metallic coating of the first printed circuit board are facing one another, and/or in that the first printed circuit board and the second printed circuit board are jointly mounted with at least one same semiconductor.

13. Method for producing a circuit according to claim 11, wherein mounting is carried out with at least one semiconductor bridging the gap between the printed circuit boards.

14. Method according to claim 13, wherein the first printed circuit board and the second printed circuit board are conveyed on a common product carrier to a mounting device.

15. Method according to claim 14, wherein the first printed circuit board and the second printed circuit board are firstly formed on a monolithic base board, and in that the base board forming the two printed circuit boards is separated before or after the mounting operation.

16. Method according to claim 15, wherein the printed circuit boards are connected together by connecting webs of the base board.

\* \* \* \* \*